United States Patent
Risch et al.

(10) Patent No.: US 7,801,004 B2
(45) Date of Patent: Sep. 21, 2010

(54) METHOD OF ERROR CORRECTION FOR A SERIES OF MARKS ON AN OPTICAL DISC

(75) Inventors: Brian G. Risch, Corvallis, OR (US); William B. Connors, Corvallis, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 1360 days.

(21) Appl. No.: 11/263,781

(22) Filed: Oct. 31, 2005

(65) Prior Publication Data
US 2007/0101209 A1 May 3, 2007

(51) Int. Cl.
*G11B 7/005* (2006.01)
(52) U.S. Cl. .................. 369/53.35; 369/47.35; 714/699
(58) Field of Classification Search ............... 369/53.35, 369/44.34, 47.35, 59.21, 53.32; 714/699
See application file for complete search history.

(56) References Cited

U.S. PATENT DOCUMENTS

| | | | |
|---|---|---|---|
| 4,556,966 A | 12/1985 | Bricot | |
| 4,860,274 A | 8/1989 | Kobayashi | |
| 5,119,363 A | 6/1992 | Satoh et al. | |
| 5,282,187 A | 1/1994 | Lee | |
| 5,315,567 A | 5/1994 | Fuji et al. | |
| 5,490,130 A * | 2/1996 | Akagiri | 369/124.08 |
| 5,528,629 A | 6/1996 | van der Krogt et al. | |
| 5,967,676 A | 10/1999 | Cutler et al. | |
| 6,028,727 A * | 2/2000 | Vishakhadatta et al. | 360/51 |
| 6,081,785 A | 6/2000 | Oshima et al. | |
| 6,109,324 A | 8/2000 | Bugner et al. | |
| 6,381,588 B2 | 4/2002 | Oshima et al. | |
| 6,401,229 B1 * | 6/2002 | Taugher | 714/769 |
| 6,510,118 B1 | 1/2003 | Morikawa | |
| 6,771,297 B2 | 8/2004 | Bronson | |
| 6,778,205 B2 | 8/2004 | Anderson et al. | |
| 6,801,487 B2 | 10/2004 | Anderson | |
| 6,844,889 B2 | 1/2005 | Bronson | |
| 6,864,907 B2 | 3/2005 | Bronson | |
| 6,872,437 B2 | 3/2005 | Van Brocklin et al. | |
| 2002/0046177 A1 * | 4/2002 | Oshima et al. | 705/51 |
| 2003/0058753 A1 * | 3/2003 | Lee et al. | 369/30.16 |
| 2003/0156525 A1 * | 8/2003 | Fan et al. | 369/110.04 |
| 2005/0058044 A1 | 3/2005 | Koegler | |
| 2005/0105728 A1 | 5/2005 | Yamaoka et al. | |
| 2005/0185537 A1 | 8/2005 | Ninomiya | |
| 2006/0083146 A1 * | 4/2006 | Isshiki et al. | 369/112.03 |

OTHER PUBLICATIONS

International Search Report for PCT/US2006/029842, mailed Jan. 10, 2007, 3 pages.
Smith, Steven W: "The Scientist and Engineer's Guide to Digital Signal Processing", 1997, Calif. Technical Publishing, San Diego, CA 49317, ISBN 0-9660176-3-3, ch. 8, 14, 18.

* cited by examiner

*Primary Examiner*—Wayne R Young
*Assistant Examiner*—Thomas D Alunkal (57) ABSTRACT

A series of marks on an optical disc are sampled to yield a series of data pulses. The marks are at least substantially angularly equidistant to one another on the optical disc. A function is performed on the series of data pulses to yield an error-corrected series of data pulses. The function is one of: frequency domain filtering, signal averaging, and signal integration.

30 Claims, 10 Drawing Sheets

METHOD OF ERROR CORRECTION FOR A SERIES OF MARKS ON AN OPTICAL DISC

BACKGROUND

Many types of optical discs include a data region and a label region. The data region is where the machine-readable digital data is written to, whereas the label region allows the user to record a human-readable label or image on the optical disc. A laser or another type of optical beam can be used to read from and/or write to the data region and the label region of an optical disc. For example, in the patent application entitled "Integrated CD/DVD Recording and Label", filed on Oct. 11, 2001, and assigned Ser. No. 09/976,877, a type of optical disc is disclosed in which a laser or other optical beam can be used to write to the label region of an optical disc.

Optical discs that have optically writable label regions, such as those disclosed in the patent application assigned Ser. No. 09/976,877, may have a number of alignment marks preformed around inner or outer circumferences of the discs. These alignment marks are detected and used to determine the current angular position on an optical disc. Determining the current angular position on an optical disc is desirable, because it ensures that an image can be optically written to the optically writable label region of such an optical disc with high precision. However, the alignment marks on the optical disc occasionally may not be detectable. For instance, debris, dirt, or other foreign material may cover the alignment marks.

Even if just a small number of the alignment marks are not detectable, image quality may be severely degraded, or the image may be totally unreadable. If a large enough number of the alignment marks are not detectable, the drive may not even recognize the disk, making imaging impossible. Therefore, it is important for the drive to recognize the alignment marks and record their position correctly.

BRIEF DESCRIPTION OF THE DRAWINGS

The drawings referenced herein form a part of the specification. Features shown in the drawing are meant as illustrative of only some embodiments of the invention, and not of all embodiments of the invention, unless otherwise explicitly indicated.

DETAILED DESCRIPTION OF THE DRAWINGS

In the following detailed description of exemplary embodiments of the invention, reference is made to the accompanying drawings that form a part hereof, and in which is shown by way of illustration specific exemplary embodiments in which the invention may be practiced. These embodiments are described in sufficient detail to enable those skilled in the art to practice the invention. Other embodiments may be utilized, and logical, mechanical, and other changes may be made without departing from the spirit or scope of the present invention. The following detailed description is, therefore, not to be taken in a limiting sense, and the scope of the present invention is defined only by the appended claims.

Representative Optical Drive

Figure 1:
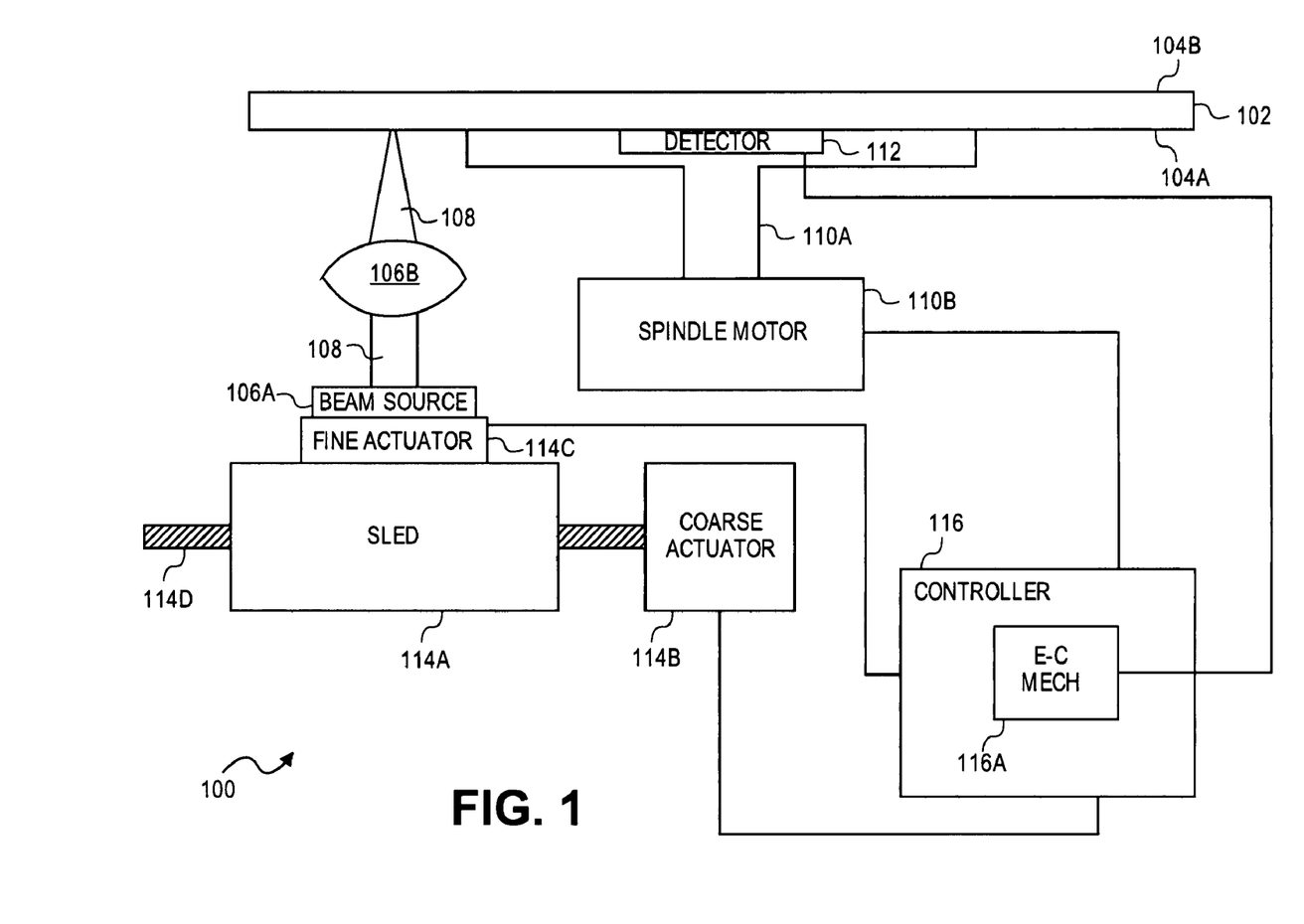
FIG. 1 is a diagram of an optical drive, according to an embodiment of the invention.

FIG. 1 shows a representative optical drive 100, according to an embodiment of the invention. The optical drive 100, or optical disc drive, is for reading from and/or writing to an optical disc 102, and is more generally referred to as a mass storage device. More specifically, the optical drive 100 is for reading from and/or writing to an optically writable label side 104A of the optical disc 102, and/or an optically writable data side 104B of the optical disc 102, which are collectively referred to as the sides 104 of the optical disc 102. As depicted in FIG. 1, the optical drive 100 is ready for reading from and/or writing to the label side 104A of the optical disc 102. For the optical drive 100 to read from and/or write to the data side 104B of the optical disc 102, the optical disc 102 would be turned over, so that the data side 104B is oriented downwards and the label side 104A is oriented upwards.

The optical drive 100 is depicted in FIG. 1 as including a beam source 106A and an objective lens 106B, which are collectively referred to as the optical mechanism 106. The beam source 106A generates an optical beam 108 that is focused by the objective lens 106B onto the optical disc 102. The optical beam source 106A may be a laser beam source, such that the optical beam 108 is a laser beam. The optical mechanism 106 may include other components besides those depicted in FIG. 1. For example, the optical mechanism 106 may include one or more mirrors, as well as a photodetector, so that reflections of the beam 108 off the optical disc 102 can be directed to the photodetector by the mirrors and detected by the photodetector. As another example, the optical mechanism 106 may include polarizing beam splitters, quarter-wave plates, voice coils, and so on.

The optical drive 100 is also depicted in FIG. 1 as including a spindle 110A and a spindle motor 110B, which are collectively referred to as the first motor mechanism 110. The spindle motor 110B rotates the spindle 110A, such that the optical disc 102 correspondingly rotates. The first motor mechanism 110 may include other components besides those depicted in FIG. 1. For instance, the first motor mechanism 110 may include a rotary encoder or another type of encoder to provide for control of the spindle motor 110B and the spindle 110A.

The optical drive 100 also includes a detector 112 situated near or at the spindle 110A. The detector 112 is for detecting alignment marks preformed on the inside circumference of the label side 104A of the optical disc 102, as is described in more detail later in the detailed description. Such alignment marks may be visible from either or both the data side 104B and the label side 104A of the optical disc 102, where the substrate of the optical disc 102 is at least substantially transparent. The detector 112 may include an optical light source and an optical detector, in one embodiment of the invention. Alternatively, the detector 112 may include other components.

The optical drive 100 is also depicted in FIG. 1 as including a sled 114A, a coarse actuator 114B, a fine actuator 114C, and a rail 114D, which are collectively referred to as the second motor mechanism 114. The coarse actuator 114B is or includes a motor that causes the sled 114A, and hence the fine actuator 114C and the optical mechanism 106 situated on the sled 114A, to move radially relative to the optical disc 102 on the rail 114D. The coarse actuator 114B thus provides for coarse or relatively larger movements of the fine actuator 114C and the optical mechanism 106.

By comparison, the fine actuator 114C also is or includes a motor, and causes the optical mechanism 106 to move radially relative to the optical disc 102 on the sled 114A. The fine actuator 114C thus provides for fine or relatively smaller movements of the optical mechanism 106. The second motor mechanism 114 may include other components besides those depicted in FIG. 1. For instance, the second motor mechanism 114 may include a linear encoder or another type of encoder to provide for control of the coarse actuator 114B and the sled 114A.

The optical drive 100 is finally depicted in FIG. 1 as including a controller 116. The controller 116 includes least an error-correcting mechanism 116A, which may be implemented in software, hardware, or a combination of software and hardware. The controller 116 controls movement of the spindle motor 110B, and thus controls rotation of the optical disc 102 on the spindle 110A, such as the angular velocity of the rotation of the optical disc 102. The controller 116 also controls the coarse actuator 114B, and thus movement of the sled 114A on the rail 114D. The controller 116 in addition controls the fine actuator 114C, and thus movement of the beam source 106A on the sled 114A.

The error-correcting mechanism 116A receives signals from the detector 112 representing the series of alignment marks preformed on the optical disc 102, and in response generates or yields an error-corrected version of these series of alignment marks, as is described in more detail later in the detailed description. The controller 116 may further include other components besides those depicted in FIG. 1. For instance, the controller 116 can be responsible for turning on and off, and focusing, the optical beam 108, via control of the beam source 106A and the objective lens 106B. Furthermore, as can be appreciated by those of ordinary skill within the art, the components depicted in the optical drive 100 are representative of one embodiment of the invention, and do not limit all embodiments of the invention.

Alignment Marks and Detection Thereof

Figure 2:
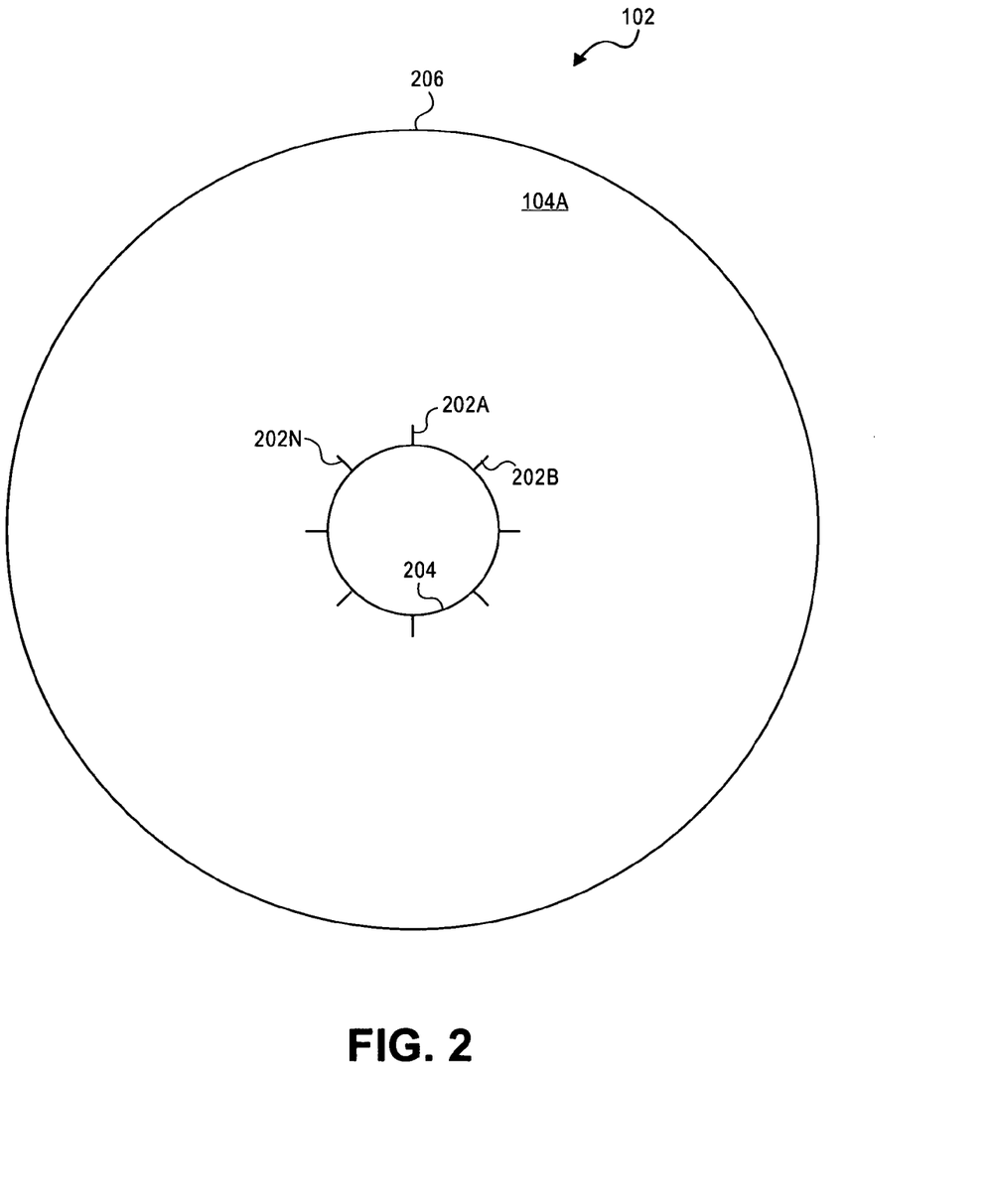
FIG. 2 is a diagram of an optically writable label side an optical disc, on which there are preformed alignment marks, according to an embodiment of the invention.

FIG. 2 shows the optical disc 102 in more detail, according to an embodiment of the invention. Specifically, the label side 104A of the optical disc 102 is depicted. The optical disc 102 has an inside circumference 204 and an outside circumference 206. On the label side 104A, around the inside circumference 204, are a number of alignment marks 202A, 202B, . . . , 202N, collectively referred to as the alignment marks 202. The alignment marks 202 may also be referred to as index marks. In some embodiments, the alignment marks 202 are preformed around the inside circumference 204 at angularly equidistant intervals. The alignment marks 202 are preformed in the sense that they are not optically written to the optical disc 102 using the optical drive 100 of FIG. 1. While the alignment marks 202 are depicted in FIG. 2 as being around the inside circumference 204, in another embodiment they may be around the outside circumference 204. Just eight of the alignment marks 202 are shown in FIG. 2 for illustrative clarity. In actuality, there may be many more of the alignment marks 202, such as 400 of the alignment marks 202.

The label side 104A is in one embodiment optically writable. For instance, the label side 104A may be part of an optical disc that is disclosed in the previously filed patent application assigned Ser. No. 09/976,877, which discloses an optically writable label side of an optical disc. As such, a desired image may be optically written on the label side 104A. In order for such an image to be optically written on the label side 104A, the optical mechanism 106 of FIG. 1 traces a path over the surface of the label side 104A, and selectively writes marks to locations or "pixels" of the label side 104A in accordance with this image as the path is traced.

Figures 3, 4:
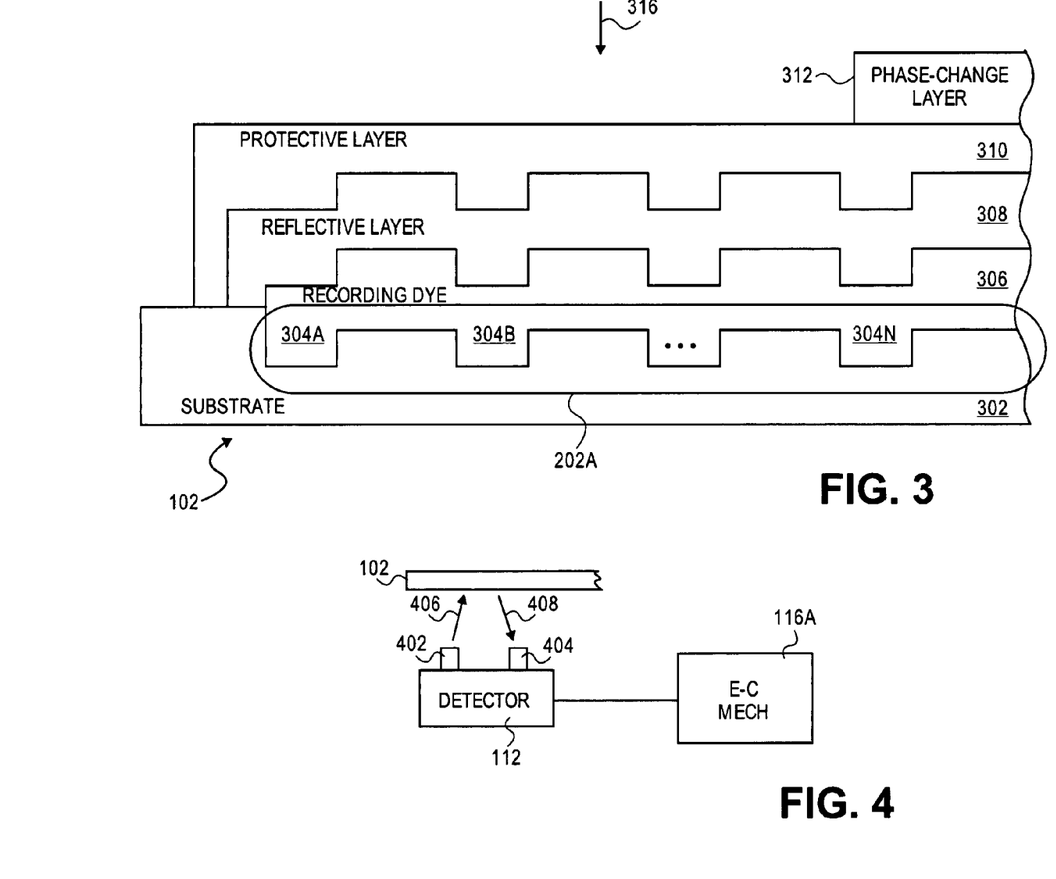
FIG. 3 is a diagram of a cross section of an optical disc, in which an alignment mark is illustrated, according to an embodiment of the invention.
FIG. 4 is a diagram showing how a detector is able to detect the alignment marks preformed on an optical disc, according to an embodiment of the invention.

FIG. 3 shows a cross-sectional view of a portion of the optical disc 102 near the inside circumference 204, according to an embodiment of the invention. The optical disc 102 has a substrate 302, which may be made from polycarbonate or another material. The substrate 302 has a series of pits, or grooves, 304A, 304B, . . . 304N, collectively referred to as the pits or grooves 304. In the cross-sectional view of FIG. 3, these pits or grooves 304 correspond to one of the alignment marks 202 of FIG. 2, specifically the alignment mark 202A. Each of the alignment marks 202 of FIG. 2 is similarly defined as a series of pits or grooves extending radially from near the inside circumference 204 of the optical disc 102.

The optical disc 102 also can include a recording dye 306 applied over the substrate 302, where this recording dye 306 corresponds to the optically writable data side 104B of the optical disc 102. The optical disc 102 can also include a reflective layer 308, such as a silver reflective layer, over the recording dye 306. Where the substrate 302 is at least substantially transparent, the optical mechanism 106 of FIG. 1 is able to optically read from or write to the optically writable data side 104B by emitting an optical beam through the substrate 302 onto the recording dye 306. The reflective layer 308 aids in such optical reading from or writing to the optically writable label side 104B.

The recording dye 306 and the reflective layer 308 substantially mirror the pits or grooves 304 within the substrate 302. That is, when the recording dye 306 is applied over the pits or grooves 304 within the substrate 302, its cross-sectional profile is such that it follows the pits or grooves 304. The recording dye 306 is lower in height where it is applied over one of the pits or grooves 304, and is higher in height where it is not applied over one of the pits or grooves 304. Similarly, when the reflective layer 308 is applied over the recording dye 306, its cross-sectional profile follows that of the recording dye 306, and thus has higher and lower regions following the higher and lower regions of the recording dye 306 itself. As a result, the detector 112 of FIG. 1 is able to detect the pits or grooves 304 from the direction indicated by the arrow 316, by emitting light against the reflective layer 308, which has higher and lower regions corresponding to the pits and grooves 304, and detecting the light that is reflected back from the reflective layer 308.

The optical disc 102 can further include a protective layer 310 over the reflective layer 308. The protective layer 310 may be lacquer or another type of protective layer. Finally, the optical disc 102 includes a phase-change layer 312, where this phase-change layer 312 corresponds to the optically writable label side 104A of the optical disc 102. The phase-change layer 312 may have a chemistry as specified in the previously filed patent application assigned Ser. No. 09/976,877. The optical mechanism 106 of FIG. 1 is able to optically write to or read from the optically writable label side 104A by emitting an optical beam onto the phase-change layer 312.

FIG. 4 shows how the detector 112 detects the alignment marks 202 on the optical disc 102, according to an embodiment of the invention. The detector 112 includes a light-emitting diode (LED) 402, or another type of optical light source, and a photodiode 404, or another type of light detector. The LED 402 emits light onto the optical disc 102, as indicated by the arrow 406, as the optical disc 102 rotates. The light is reflected from the optical disc 102, as indicated by the arrow 408, where it is detected by the photodiode 404. The light is reflected differently depending on whether it is reflected from the pits or grooves of one of the alignment marks 202, such that more or less reflected light is detected by the photodiode 404. In this way, the alignment marks 202 can be detected. The detector 112 may also be referred to as, or may be considered to be part of, an optical processing unit or an optical pickup unit (OPU).

The output of the detector 112 is ultimately received by the error-correcting mechanism 116A. The error-correcting mechanism 116A processes the output of the detector 112, or otherwise performs an algorithm on the output of the detector 112, as is described in more detail later in the detailed description. The output of the detector 112 is a series of data pulses corresponding to the alignment marks 202. As can be appreciated by those of ordinary skill within the art, the output of the detector 112 may be processed in different ways before being received by the error-correcting mechanism 116A. For instance, it may pass through various transistors, resistors, comparators, and amplifiers, as may be conventionally or otherwise accomplished.

Figure 5:
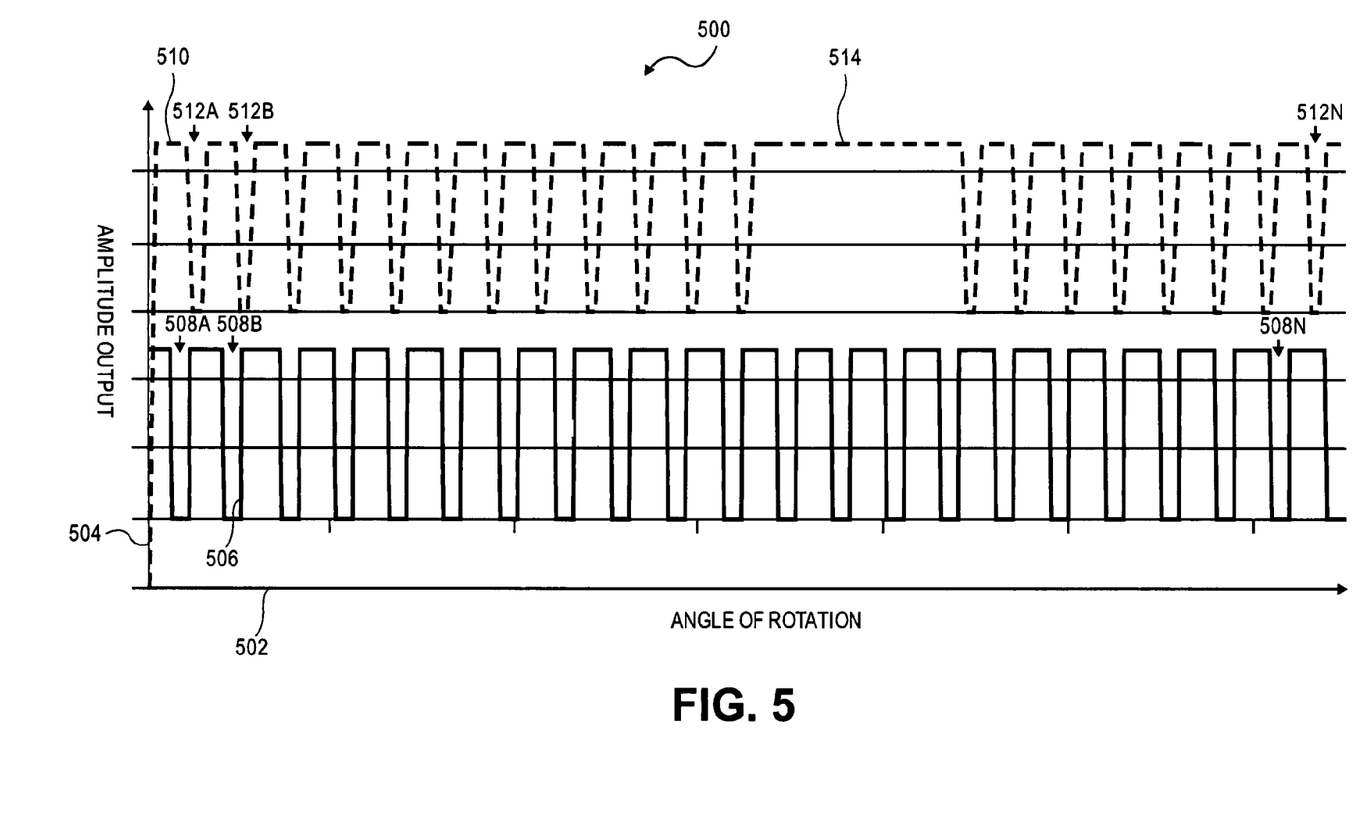
FIG. 5 is a graph of two example samples of series of alignment marks on an optical disc, according to an embodiment of the invention.

FIG. 5 shows a graph 500 of two example samples of the output of the detector 112, as ultimately received by the error-correcting mechanism 116A, according to an embodiment of the invention. The output is obtained by the detector 112 detecting light reflections from the alignment marks 202, yielding a series of data pulses corresponding to the alignment marks 202 detected. The x-axis 502 of the graph 500 denotes the angle of rotation of the optical disc 102. The y-axis 504 of the graph 504 denotes the amplitude of the output of the detector 112, as may be processed in different ways before being received by the error-correction mechanism 116A.

The signal 506 represents data detected by the detector 112 representing a series of the alignment marks 202 in which all of the alignment marks 202 within the series have been properly detected. As such, the signal 506 includes a number of valleys, or troughs, 508A, 508B, . . . , 508N, collectively referred to as the valleys or troughs 508. The valleys 508 each correspond to one of the alignment marks 202 being detected by the detector 112. That is, each of the valleys 508 corresponds to the pits or grooves of one of the alignment marks 202 being detected by the detector 112. The pits or grooves of the alignment marks 202 result in the amplitude of the output of the detector 112 being lower than where there are no pits or grooves on the optical disc 102, and thus no alignment marks 202. The valleys or troughs as referred to herein may in one embodiment be considered data pulses, whereas in another embodiment the peaks of the between the valleys or troughs may be considered data pulses. In another embodiment, the pits or grooves may result in the output of the detector 112 being higher.

By comparison, the signal 510 represents data detected by the detector 112 representing a sample of a series of the alignment marks 202 in which not all of the alignment marks 202 within the series have been properly detected. The signal 510 includes a number of valleys, or troughs, 512A, 512B, . . . , 512N, collectively referred to as the valleys or troughs 512. The valleys 512 each correspond to one of the alignment marks 202 being detected by the detector 112, as has been described above in relation to the signal 506.

However, the signal 510 includes an area 514 in which there are no valleys 512. In this area 514, the corresponding alignment marks 202 may have obfuscated by dirt, debris, or another foreign material. As a result, the detector 112 is unable to detect these alignment marks, such that the signal 510 within the area 514 indicates none of the alignment marks 202 as being present on the optical disc 102 at this corresponding angle of rotation as measured against the x-axis 502. Comparing the area 514 of the signal 510 against the corresponding area of the signal 1010 shows that four valleys are missing within the area 514 of the signal 510, meaning that four of the alignment marks 202 were not detected by the detector 112. That is, four data pulses may be considered as being missing from the signal 510.

As a result, the optical disc 102 may not be properly recognized by the drive, or an indexing error resulting from some of the alignment marks 202 not being detected may cause image quality degradation or illegibility. Therefore, the purpose of the error-correcting mechanism 116A, in one embodiment of the invention, is to correct the signal 510 so that it properly reflects all the alignment marks 202 on the optical disc 102. That is, the error-correcting mechanism 116 at least substantially fills in missing information, such as missing data pulses, corresponding to the missing alignment marks within the sample of the series of alignment marks 202 represented by the signal 510.

Method to Correct Alignment Mark Misidentification

Figure 6:
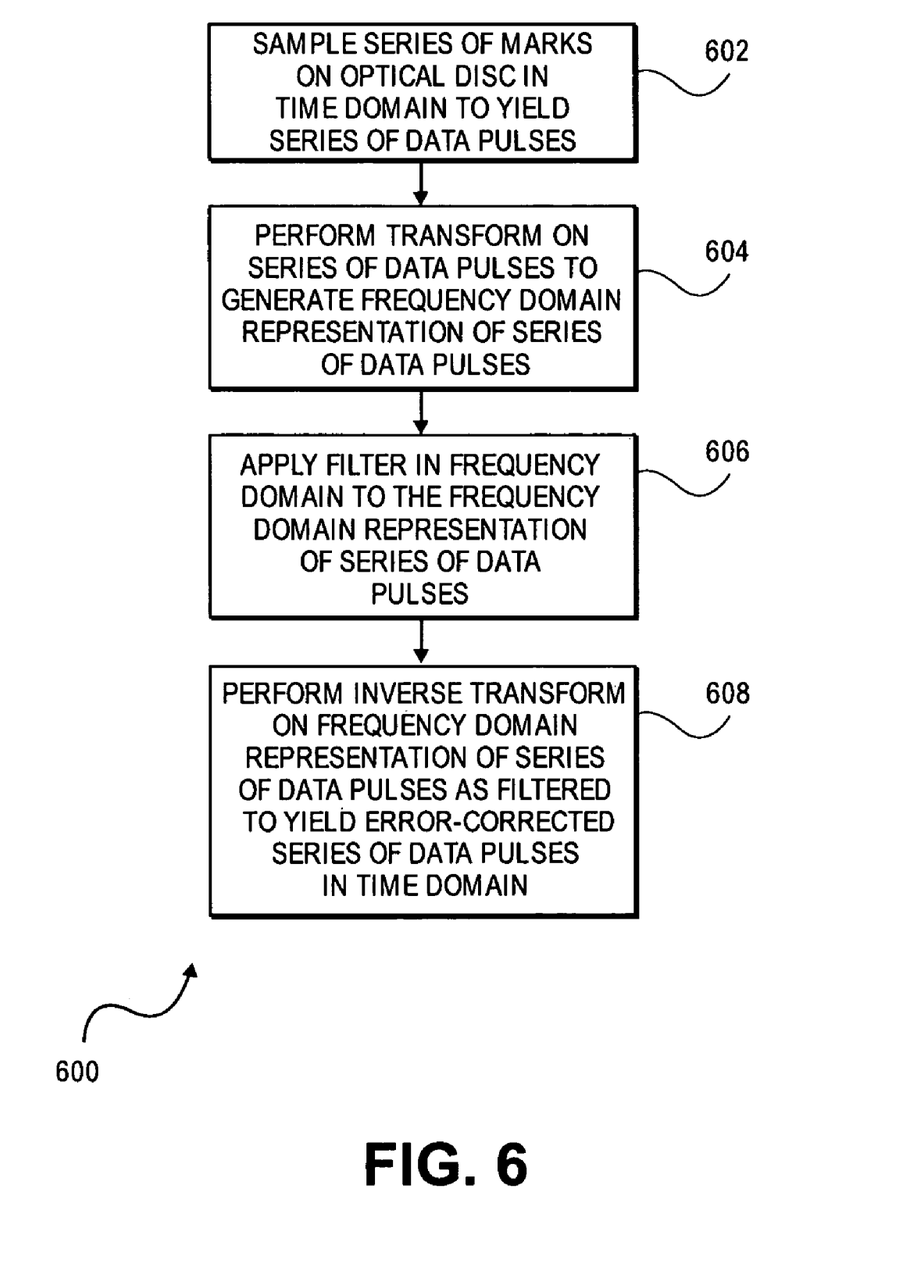
FIG. 6 is a flowchart of a method to error-correct a sample of series of alignment marks to compensate for errors in detecting one or more of the alignment marks on an optical disc, according to an embodiment of the invention.

FIG. 6 shows a method 600 to correct errors within the data representing the series of the alignment marks 202 represented by the signal 510, according to an embodiment of the invention. Different parts of the method 600 may be performed by the detector 112, the error-correcting mechanism 116A of the controller 116, as well as other components of the optical drive 100 of FIG. 1. First, the series of the alignment marks 202 is sampled in the time domain, to yield the signal 510 that represents this sample of the series of the alignment marks 202 (602). The signal 510 has a series of data pulses therein. Such sampling may be performed by the detector 112 in one embodiment of the invention.

The signal 510 is in the time domain, in that the x-axis 502 of the graph 500, while denoting the angle of rotation, can be construed as corresponding to time. This is because the different angles of rotation occur over time, as the optical disc 102 is rotated. The signal 510 of FIG. 1 is the case where the optical disc 102 is rotated at constant angular velocity, since the valleys or troughs 512 occur equidistantly to one another. In the case where the optical disc 102 is rotated at constant linear velocity, by comparison, the valleys or troughs may be further spread out over time—that is, as the angle of rotation increases—within a given period of time.

Sampling of the series of the alignment marks 202 to yield a series of data pulses may be accomplished without performing oversampling. Oversampling is the process by which the alignment marks 202 are sampled more than one time. That is, the optical disc 102 makes more than one complete rotation, so that the detector 112, for instance, detects each of the alignment marks 202 more than once. To ensure the most rapid writing performance of an image to the optically writable label side 104A of the optical disc 102, oversampling is desirably avoided, so that the optical disc 102 does not have to be completely rotated a number of times to obtain the sample of the series of the alignment marks 202. However, in a different embodiment of the invention, oversampling of the alignment marks 202 may be performed to obtain a higher image precision at the cost of reduced write speed. Certain types of optical drives, for instance, are capable of oversampling two, four, eight, or more times, particularly when data is being read.

Next, the method 600 performs a transform on the series of data pulses to generate a frequency domain representation of the series of data pulses (604). Such transformation may be performed by the error-correcting mechanism 116A in one embodiment of the invention. The transform that is performed may be a Fast Fourier Transform (FFT), a Discrete Sine Transform (DST), a Discrete Cosine Transform (DCT), or another type of transform that transforms the signal 510 from the time domain to the frequency domain, as can be appreciated by those of ordinary skill within the art.

Figure 7:
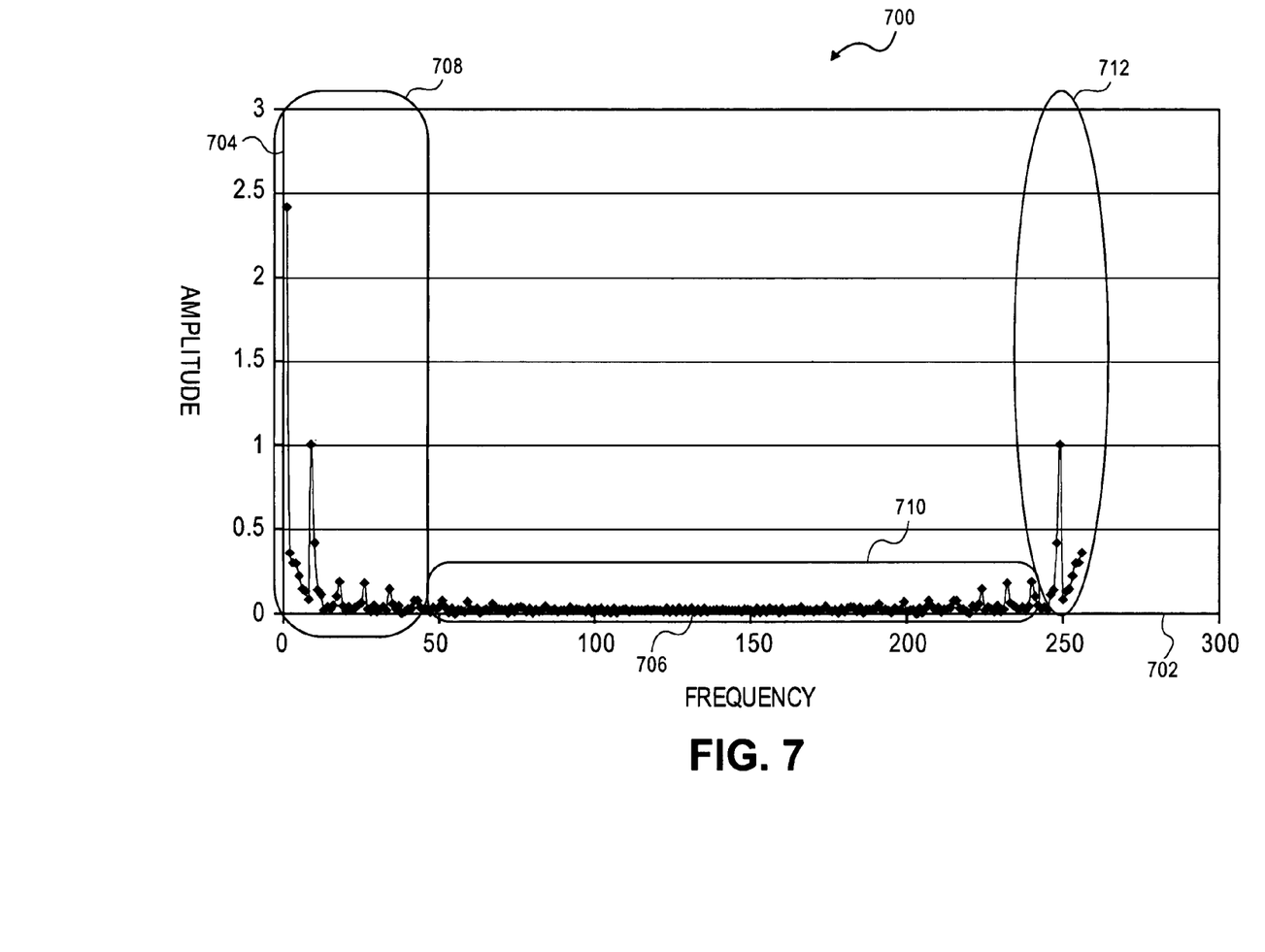
FIG. 7 is a graph of an example frequency domain transformation of a sample of a series of alignment marks on an optical disc, according to an embodiment of the invention.

FIG. 7 shows an example graph 700 of the transformation of a series of data pulses representing the series of the alignment marks 202 into the frequency domain, according to an embodiment of the invention. The x-axis 702 of the graph 700 denotes frequency, whereas the y-axis 704 of the graph 700 denotes signal amplitude. The frequency domain representation 706 depicted in the graph 700 corresponds to the frequency domain representation of the signal 510 of FIG. 5.

The frequency domain representation 706 may be broadly construed as having three components: a low-frequencies component 708, a mid-frequencies component 710, and a high-frequencies component 712. The low-frequencies component 708 encodes information about the periodicity of the alignment marks 202 detected and reflected within the signal 510. The high-frequency component 712 encodes information about the shape of each of the pulses between the valleys 512 of the signal 510, as well as the sampling window. However, the mid-frequencies component 710 encodes most of the information about the missing valleys within the area 514 of the signal 510, as well as information about any noise that is detected in the process of the detector 112 detecting the alignment marks 202.

Figure 8:
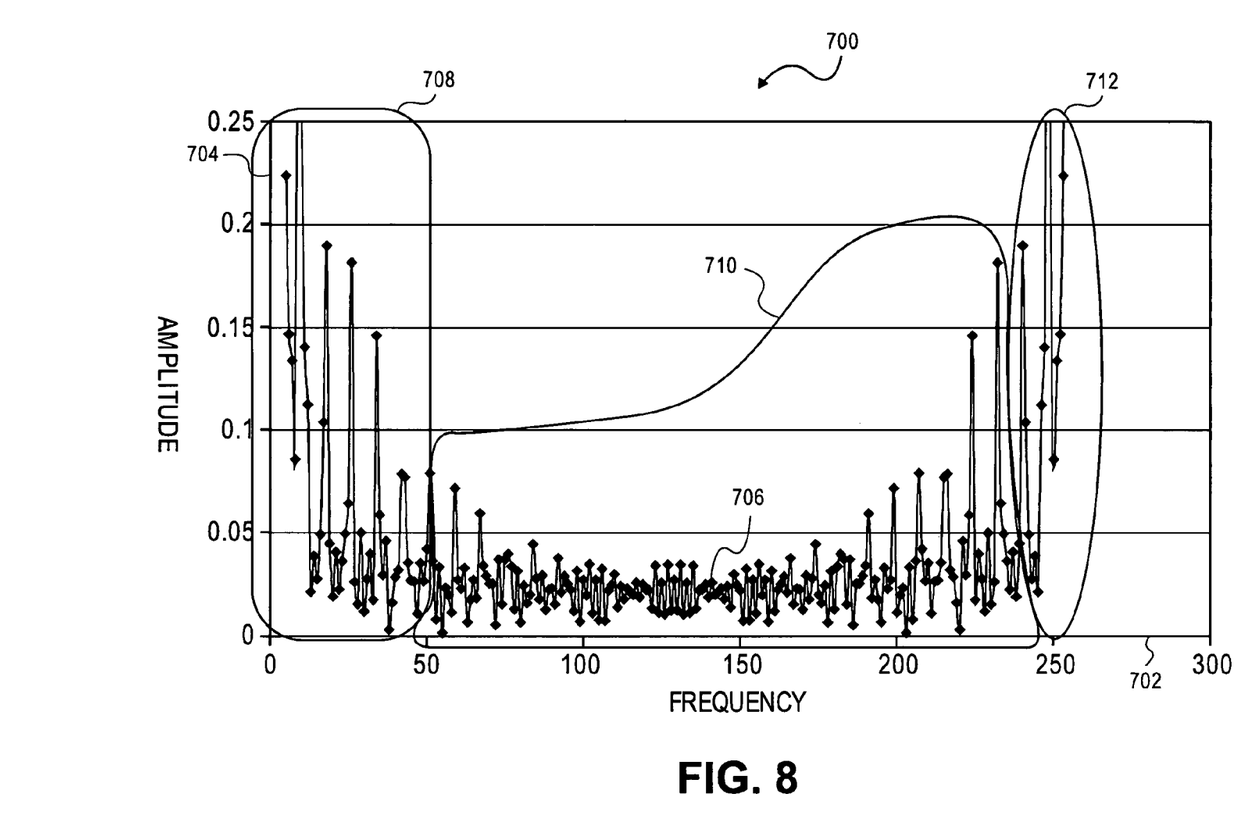
FIG. 8 is a portion of the graph of FIG. 7 in more detail, according to an embodiment of the invention.

FIG. 8 shows a portion of the example graph 700 of FIG. 7 in more detail, according to an embodiment of the invention. In particular, the graph 700 in FIG. 7 is depicted along the y-axis 704 from an amplitude value of 0 to an amplitude value of 3. By comparison, the graph 700 in FIG. 8 is depicted along the y-axis 704 from an amplitude value of 0 to an amplitude value of 0.25. In FIG. 8, the mid-frequencies component 710 of the frequency domain representation 706 is more clearly shown as compared to FIG. 7.

Referring back to FIG. 6, the method 600 next applies a filter in the frequency domain to the frequency domain representation of the series of data pulses representing the series of alignment marks 202 (606). The error-correcting mechanism 116A can apply this filter in one embodiment of the invention. The filter that is applied can be a band-pass filter, the functional equivalent of a band-pass filter, a band-reject filter, or the functional equivalent of a band-reject filter, to reject the component 710 of the frequency domain representation 706 of the signal 510, such that the filter passes just frequency components that contain useful information about the periodic marks that are present. In this case, the mid-frequencies component 710 is rejected and the low-frequencies component 708 and the high-frequencies component 712 of the frequency domain representation 706 is selected, or passed. That is, the filter filters out the components of the frequency domain representation 706 of the signal 510 corresponding to the missing valleys, data pulses, or alignment marks 202, within the signal 510, and/or the components corresponding to noise.

Figure 9:
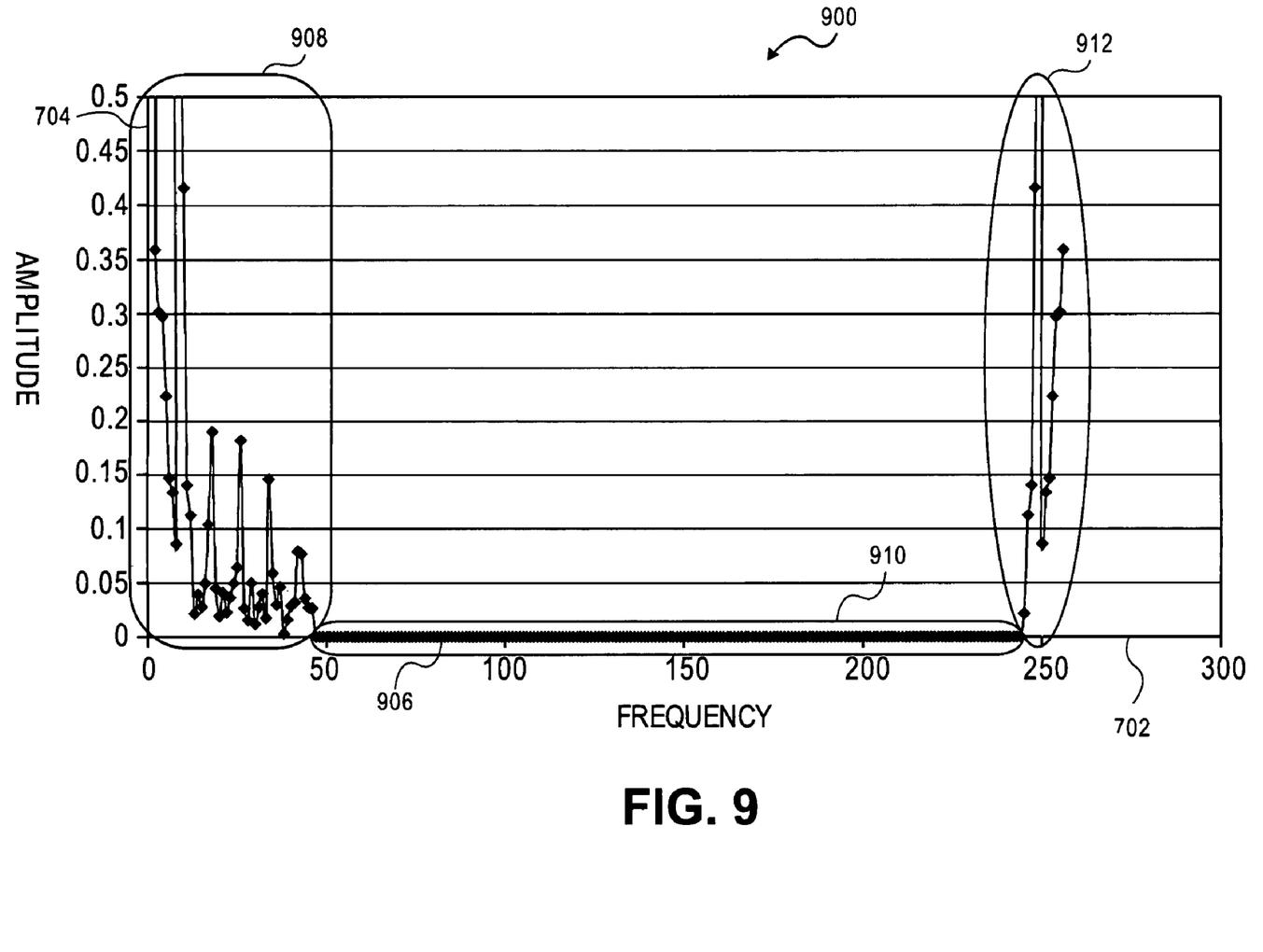
FIG. 9 is a graph of the frequency domain transformation of FIGS. 7 and 8 after an example filter has been applied, according to an embodiment of the invention.

FIG. 9 shows an example graph 900 after a filter has been applied to the frequency domain representation 706, to yield the frequency domain representation 906, according to an embodiment of the invention. The x-axis 702 of the graph 900 again denotes frequency, as in the graph 700, whereas the y-axis 704 of the graph 900 again denotes signal amplitude, as in the graph 700. The y-axis 704 in FIG. 9 measures amplitude from 0 to 0.5.

The frequency domain representation 906 has a low-frequencies component 908, a mid-frequencies component 910, and a high-frequencies component 912. The low-frequencies component 908 and the high-frequencies component 912 are identical to the low-frequencies component 708 and the high-frequencies component 712 of the frequency domain representation 706 prior to application of the filter. However, the mid-frequencies component 910 of the frequency domain representation 906 has a flat, zero-amplitude response as compared to the mid-frequencies component 710 of the frequency domain representation 706.

The mid-frequencies component 910 thus reflects the application of the filter to the frequency domain representation 706 in yielding the frequency domain representation 906 having the mid-frequencies component 910. Information about the missing valleys or data pulses, and thus the missing alignment marks, as well as noise information, is removed from the frequency domain representation 706 via application of the filter thereto to result in the frequency domain representation 906. Therefore, the frequency domain representation 906 is a cleaner version of the frequency domain representation 706, because it no longer reflects missing alignment marks or valleys, and no longer reflects noise, as the frequency domain representation 706 does.

Referring back to FIG. 6, the method 600 finally performs an inverse transform on the frequency domain representation of the series of data pulses representing the series of the alignment marks 202, as has been filtered (608). The error-correcting mechanism 116A can perform this inverse transform in one embodiment of the invention. The inverse transform that is applied is the inverse of the transform that was previously applied in part 604 of the method 600. Thus, where the transform is an FFT, a DST, or a DCT, for instance, the inverse transform is an inverse FFT, an inverse DST, or an inverse DCT, respectively. Performing the inverse transform on the frequency domain representation of the series of data pulses representing the series of alignment marks 202 as has been filtered results in an error-corrected sample of the series of data pulses representing the series of the alignment marks 202 in the time domain. That is, data regarding the missing alignment marks is effectively restored.

Figure 10:
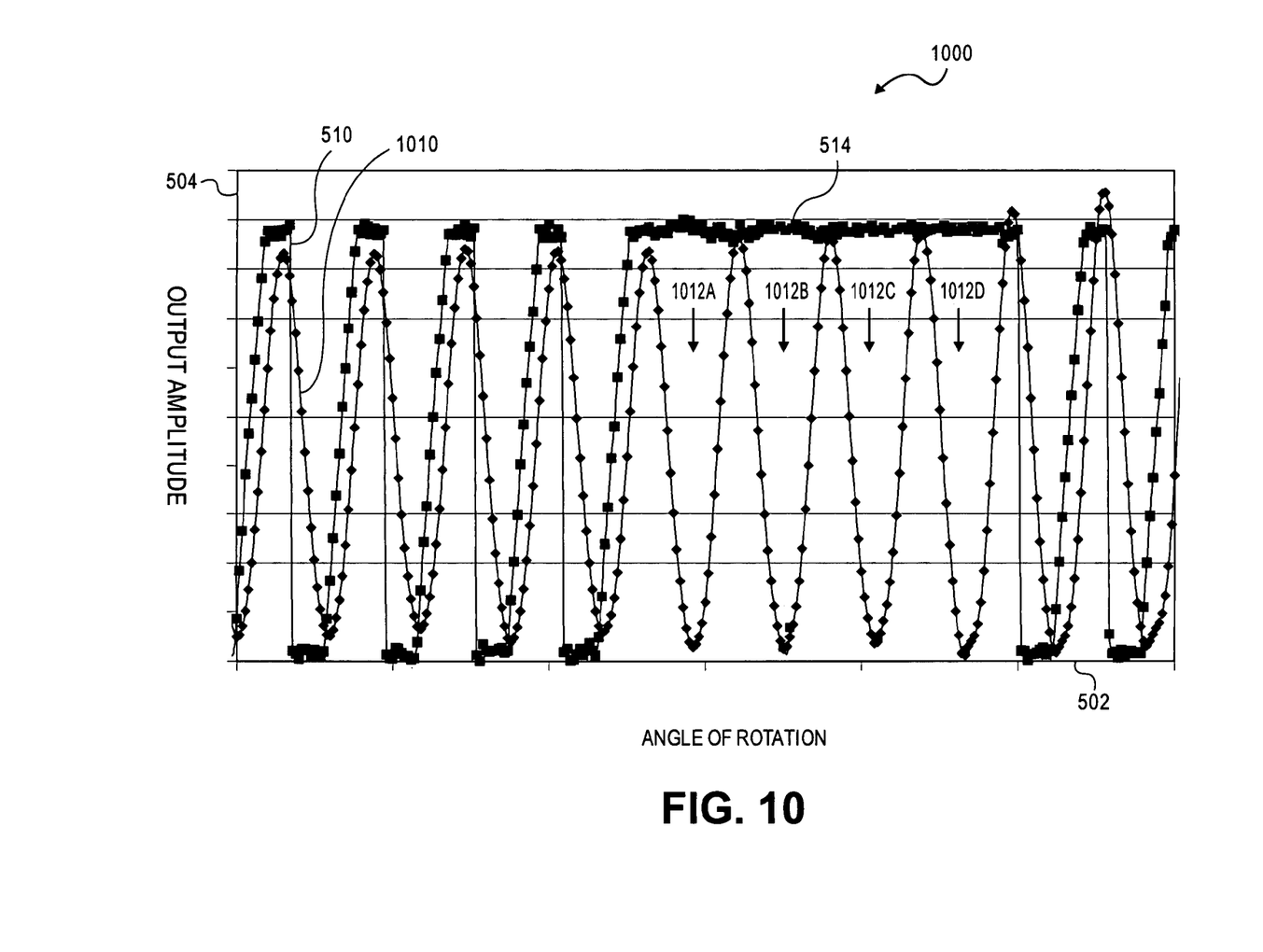
FIG. 10 is a graph of an example error-corrected sample of a series of alignment marks on an optical disc resulting from performing an inverse transform on the frequency domain transformation of FIG. 9, according to an embodiment of the invention.

FIG. 10 shows an example graph 1000 after the frequency domain representation 906 has been transformed back to the time domain via application of an inverse transform, according to an embodiment of the invention. The x-axis 502 measures the angle of rotation and corresponds to the time domain, like the x-axis 502 of the graph 500 of FIG. 5, and the y-axis 504 measures output amplitude, like the y-axis 502 of the graph 500. Two signals are particularly depicted in FIG. 10: the original signal 510 the represents the original sample of the series of the alignment marks 202, as well as the error-corrected signal 1010 that is an error-corrected version of this sample achieved the processing of the parts 604, 606, and 608 of the method 600. That is, the error-corrected signal 1010 results from performing an inverse transform on the frequency domain representation 906.

As has been described, the area 514 of the original signal 510 does not include any valleys or data pulses, and thus denotes the failed detection of four of the alignment marks 202 in particular. However, the error-corrected signal 1010 has valleys, or troughs, 1012A, 1012B, 1012C, and 1012D, collectively referred to as the valleys 1012, in an area corresponding to the area 514 of the original signal 510. The processing of the parts 604, 606, and 608 of the method 600 effectively "filled in" the valleys 1012 (i.e., the data pulses) within the error-corrected signal 1010 that were missing from the original signal 510. As such, even though the alignment marks corresponding to these valleys 1012 were not detected by the detector 112, they ultimately are represented within error-corrected signal 1010.

Additional Embodiments and Conclusion

Figure 11:
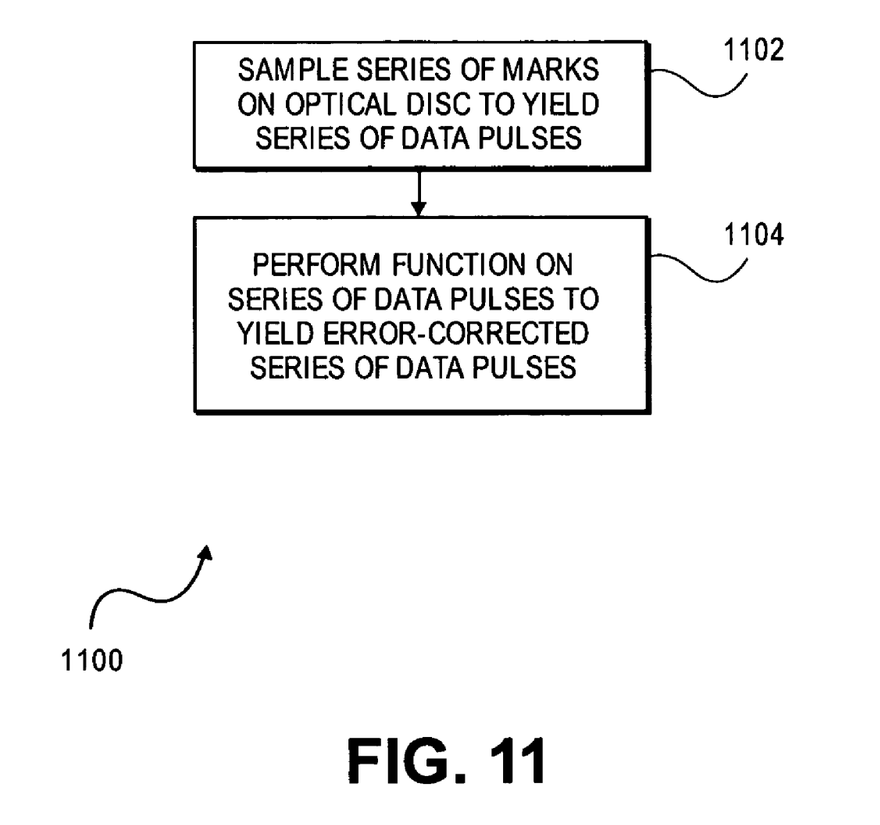
FIG. 11 is a flowchart of a method for generating an error-corrected version of a sample of a series of alignment marks on an optical disc, according to an embodiment of the invention.

The embodiments of the invention that have been described in the previous section of the detailed description transform a time domain representation of a sample of a series of alignment marks into a frequency domain representation, which is then filtered and subjected to an inverse transform to yield an error-corrected series of alignment marks in the time domain. However, other embodiments of the invention are broader in that they do not require transformation of the sample of the series of alignment marks from the time domain to the frequency domain, and/or do not require filtering of the sample of the series of alignment. FIG. 11 shows such a method 1100 for generating an error-corrected sample of a series of alignment marks on an optical disc, according to an embodiment of the invention.

First, a series of alignment marks on an optical disc are sampled (1102), as in part 602 of the method 600 of FIG. 6. The detector 112 may detect this sample of the series of alignment marks, to yield a series of data pulses corresponding to the series of alignment marks. The resulting sample may be that which is represented by the signal 510 of FIG. 5, for instance. Oversampling may either be performed, or not performed. Next, a function is performed on the series of data pulses to yield an error-corrected series of data pulses that represents the series of alignment marks (1104). The error-correcting mechanism may perform this function, for instance. The error-corrected series desirably has data representing any missing alignment marks, or corresponding valleys or data pulses, "filled in." The error-corrected sample may be that which is represented by the signal 1010 of FIG. 10, for instance.

In one embodiment, performance of the function in part 1104 of the method 1100 includes parts 604, 606, and 608 of the method 600 of FIG. 6 that have been described. That is, frequency domain filtering is performed on the series of data pulses representing the sample of the series of alignment marks to yield an error-corrected series of data pulses. In another embodiment, signal integration may be performed, as can be appreciated by those of ordinary skill within the art. In still another embodiment, signal averaging may be performed, as can also be appreciated by those of ordinary skill within the art.

Signal integration involves integrating the signal 510 over a number of different consecutive portions of the sample represented by the signal 510. Where the integration value of any of these portions is greater than the average of the integration values of all the portions by more than a predetermined threshold, the corresponding portion in question is replaced within the signal 510 by a running average that has an integration value that is not greater than the average by more than the predetermined threshold. For example, in relation to the signal 510 depicted in FIG. 5, there. may be four portions over which the signal 510 is integrated. The first and the second portions may be to the left of the area 514 within the signal 510. The third portion may include the area 514, whereas the fourth portion may be to the right of the area 514 within the signal 510. The third portion has a higher integration value, because it does not have valleys within the area 514 of the signal 510 that serve to decrease the integration value. Therefore, this portion is replaced by the running average of the other portions of the signal 510 to result in an error-corrected signal.

Signal averaging involves averaging the signal 510 over a number of different consecutive portions of the sample represented by the signal 510. Where the average value of any of these portions is greater than the average of all the portions by more than a predetermined threshold, the corresponding portion is replaced within the signal 510 by one of the other portions that has an average value that is not greater than the average of all the portions by more than the predetermined threshold. For example, in relation to the signal 510 depicted in FIG. 5, the signal 510 may again include the same four portions as denoted in the previous paragraph. Because the third portion has an average value that is greater than the average over the signal 510 as a whole, due to its lack of valleys within the area 514, this portion is replaced by one of the other portions of the signal 510 to result in an error-corrected signal.

It is noted, therefore, that although specific embodiments have been illustrated and described herein, it will be appreciated by those of ordinary skill in the art that any arrangement calculated to achieve the same purpose may be substituted for the specific embodiments shown. This application is intended to cover any adaptations or variations of the disclosed embodiments of the present invention. It is thus manifestly intended that this invention be limited only by the claims and equivalents thereof.

We claim:

1. A method comprising:
   sampling a series of marks on an optical disc to yield a series of data pulses in a time domain, the marks being at least substantially angularly equidistant to one another on the optical disc;
   performing a transform on the series of data pulses to generate a frequency domain representation of the series of data pulses;
   applying a filter in a frequency domain to the frequency domain representation of the series of data pulses, comprising filtering out components of the frequency domain representation of the series of data pulses that correspond at least to one or more missing data pulses from the series of data pulses; and,
   performing an inverse transform on the frequency domain representation of the data pulses as filtered to yield an error-corrected series of data pulses in the time domain.

2. The method of claim 1, wherein sampling the series of marks on the optical disc to yield the series of data pulses in the time domain comprises sampling the series of marks on the optical disc, without oversampling the series of marks on the optical disc, to yield the series of data pulses in the time domain.

3. The method of claim 1, wherein sampling the series of marks on the optical disc to yield the series of data pulses in the time domain comprises oversampling the series of marks on the optical disc to yield the series of data pulses in the time domain.

4. The method of claim 1, wherein performing the transform on the series of data pulses to generate the frequency domain representation of the series of data pulses comprises performing a Fast Fourier Transform (FFT) on the series of data pulses to generate the frequency domain representation of the series of marks.

5. The method of claim 4, wherein performing the inverse transform on the frequency domain representation of the series of data pulses as filtered to yield the error-corrected series of data pulses in the time domain comprises performing an inverse FFT on the frequency domain representation of the series of data pulses as filtered to yield the error-corrected series of data pulses in the time domain.

6. The method of claim 1, wherein performing the transform on the series of data pulses to generate the frequency domain representation of the series of data pulses comprises performing one of a Discrete Sine Transform (DST) or a Discrete Cosine Transform (DCT) on the series of data pulses to generate the frequency domain representation of the series of data pulses.

7. The method of claim 6, wherein performing the inverse transform on the frequency domain representation of the series of data pulses as filtered to yield the error-corrected series of data pulses in the time domain comprises performing one of an inverse DST or an inverse DCT on the frequency domain representation of the series of data pulses as filtered to yield the error-corrected series of data pulses in the time domain.

8. The method of claim 1, wherein applying the filter in the frequency domain to the frequency domain representation of the series of data pulses also comprises applying a band-reject filter in the frequency domain to the frequency domain representation of the series of data pulses.

9. The method of claim 1, wherein applying the filter in the frequency domain to the frequency domain representation of the series of data pulses also comprises applying a filter at least substantially functionally equivalent to a band-reject filter in the frequency domain to the frequency domain representation of the series of data pulses.

10. The method of claim 1, wherein applying the filter in the frequency domain to the frequency domain representation of the series of data pulses also comprises filtering out components of the frequency domain representation of the series of data pulses that correspond at least to noise within the frequency domain representation of the series of data pulses.

11. The method of claim 1, wherein sampling the series of marks on the optical disc to yield the series of data pulses in the time domain is such that the series of data pulses is missing one or more data pulses, such that performing the transform, applying the filter, and performing the inverse transform at least substantially effectively fills in the one or more data pulses that are missing, within the error-corrected series of data pulses in the time domain.

12. The method of claim 1, wherein the series of marks comprises a series of alignment marks preformed on an optically writable label surface of the optical disc.

13. The method of claim 1, wherein the series of marks comprises a series of alignment marks preformed at equidistant intervals around an inside circumference or an outside circumference of the optical disc.

14. An optical disc drive comprising:
a detector to detect a series of marks on an optical disc inserted into the optical drive as the optical disc is rotated, yielding a series of data pulses corresponding to the series of marks, the marks being at least substantially equidistant to one another on the optical disc; and,
an error-correcting mechanism to yield an error-corrected series of data pulses by applying a filter to the series of data pulses in a frequency domain,
wherein the filter is to filter out components of a signal representing the series of marks that correspond at least to one or more of the marks not being detected by the detector.

15. The optical drive of claim 14, wherein the detector is to detect the series of marks on the optical disc inserted into the optical drive as the optical disc is rotated without performing oversampling.

16. The optical drive of claim 14, wherein the error-correcting mechanism is to yield the error-corrected series of data pulses by transforming the series of data pulses from a time domain into the frequency domain, applying the filter in the frequency domain, and inverse-transforming the series of data pulses as has been transformed into the frequency domain and as to which the filter has been applied back into the time domain.

17. The optical drive of claim 14, wherein the error-correcting mechanism is to yield the error-corrected sample series of data pulses by utilizing one of:
a Fast Fourier Transform (FFT) or a corresponding inverse FFT;
a Discrete Sine Transform (DST) or a corresponding inverse DST; and,
a Discrete Cosine Transform (DCT) or a corresponding inverse DCT.

18. The optical drive of claim 14, wherein the filter is a band-reject or a band-pass filter.

19. The optical drive of claim 14, wherein the filter is functionally equivalent to a band-reject or a band-pass filter.

20. The optical drive of claim 14, wherein the series of marks comprises a series of alignment marks preformed at equidistant intervals around an inside circumference or an outside circumference of an optically writable label surface of the optical disc.

21. A mass storage device comprising:
means for detecting a series of marks on an optically readable medium inserted into the mass storage device, yielding a series of data pulses corresponding to the series of marks, the marks being at least substantially equidistant to one another on the optically readable medium; and,
means for generating an error-corrected series of data pulses corresponding by applying a filter on the series of data pulses in a frequency domain,
wherein the filter is to filter out components of a signal representing the series of marks that correspond at least to one or more of the marks not being detected by the detector.

22. The mass storage device of claim 21, wherein the error-correcting mechanism generates the error-corrected series of data pulses by transforming the series of data pulses from a time domain into the frequency domain, applying the filter in the frequency domain, and inverse-transforming the series of data pulses as has been transformed into the frequency domain and as to which the filter has been applied back into the time domain.

23. A method comprising:
sampling a series of marks on an optical disc to yield a series of data pulses in a time domain, the marks being at least substantially angularly equidistant to one another on the optical disc;
performing a transform on the series of data pulses to generate a frequency domain representation of the series of data pulses;
applying a filter in a frequency domain to the frequency domain representation of the series of data pulses; and,
performing an inverse transform on the frequency domain representation of the data pulses as filtered to yield an error-corrected series of data pulses in the time domain,
wherein sampling the series of marks on the optical disc to yield the series of data pulses in the time domain is such that the series of data pulses is missing one or more data pulses, such that performing the transform, applying the filter, and performing the inverse transform at least substantially effectively fills in the one or more data pulses that are missing, within the error-corrected series of data pulses in the time domain.

24. The method of claim 23, wherein applying the filter in the frequency domain to the frequency domain representation of the series of data pulses also comprises applying a band-reject filter in the frequency domain to the frequency domain representation of the series of data pulses.

25. The method of claim 23, wherein applying the filter in the frequency domain to the frequency domain representation of the series of data pulses also comprises applying a filter at least substantially functionally equivalent to a band-reject filter in the frequency domain to the frequency domain representation of the series of data pulses.

26. The method of claim 23, wherein applying the filter in the frequency domain to the frequency domain representation of the series of data pulses also comprises filtering out components of the frequency domain representation of the series of data pulses that correspond at least to noise within the frequency domain representation of the series of data pulses.

27. The method of claim 23, wherein the series of marks comprises a series of alignment marks preformed on an optically writable label surface of the optical disc.

28. An optical disc drive comprising:
a detector to detect a series of marks on an optical disc inserted into the optical drive as the optical disc is rotated, yielding a series of data pulses corresponding to the series of marks, the marks being at least substantially equidistant to one another on the optical disc; and,
an error-correcting mechanism to yield an error-corrected series of data pulses by transforming the series of data pulses from a time domain into the frequency domain, applying a filter to the series of data pulses in the frequency domain, and inverse-transforming the series of data pulses as has been transformed into the frequency domain and as to which the filter has been applied back into the time domain.
wherein the series of data pulses in the time domain is missing one or more data pulses, such that performing the transform, applying the filter, and performing the inverse transform by the error-correcting mechanism at least substantially effectively fills in the one or more data pulses that are missing, within the error-corrected series of data pulses in the time domain.

29. The optical disc drive of claim 28, wherein the error-correction mechanism is to further apply a band-reject filter in the frequency domain to the frequency domain representation of the series of data pulses.

30. The optical disc drive of claim 28, wherein the series of marks comprises a series of alignment marks preformed on an optically writable label surface of the optical disc.

* * * * *